United States Patent
Kurihara

(10) Patent No.: US 9,412,785 B2
(45) Date of Patent: Aug. 9, 2016

(54) METHOD OF MANUFACTURING SEMICONDUCTOR APPARATUS

(71) Applicant: CANON KABUSHIKI KAISHA, Tokyo (JP)

(72) Inventor: Masaki Kurihara, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 142 days.

(21) Appl. No.: 14/337,488

(22) Filed: Jul. 22, 2014

(65) Prior Publication Data

US 2015/0056741 A1  Feb. 26, 2015

(30) Foreign Application Priority Data

Aug. 22, 2013  (JP) .................................. 2013-172662

(51) Int. Cl.
*H01L 21/00* (2006.01)
*H01L 27/146* (2006.01)
*H01L 31/0232* (2014.01)

(52) U.S. Cl.
CPC .... *H01L 27/14687* (2013.01); *H01L 27/14621* (2013.01); *H01L 27/14685* (2013.01); *H01L 31/02327* (2013.01)

(58) Field of Classification Search
CPC .................. H01L 27/14621; H01L 27/14685; H01L 27/14687
See application file for complete search history.

(56) References Cited

U.S. PATENT DOCUMENTS

| 6,472,698 | B1 * | 10/2002 | Nakashiba ........ H01L 27/14601 257/222 |
| 7,294,524 | B2 | 11/2007 | Park et al. |
| 7,919,350 | B2 | 4/2011 | Cho et al. |
| 8,753,917 | B2 * | 6/2014 | Gambino .......... H01L 27/14632 257/E31.053 |
| 9,129,957 | B1 * | 9/2015 | Ho ..................... H01L 23/49816 |
| 2001/0043043 | A1 * | 11/2001 | Aoyama ............. H01L 51/5036 313/506 |
| 2005/0090035 | A1 * | 4/2005 | Kim .................. H01L 27/14632 438/70 |
| 2006/0118795 | A1 * | 6/2006 | Araki ................ H01L 27/14634 257/83 |

(Continued)

FOREIGN PATENT DOCUMENTS

JP  2007-073966 A  3/2007
JP  2007-088459 A  4/2007

(Continued)

*Primary Examiner* — Brett Feeney
*Assistant Examiner* — Sophia Nguyen
(74) *Attorney, Agent, or Firm* — Fitzpatrick, Cella, Harper & Scinto

(57) ABSTRACT

A method of manufacturing a semiconductor apparatus comprising forming an electrode on a structure provided on a substrate, the structure including a wiring pattern and an interlayer insulation film, forming a first film covering the electrode and the structure, forming an opening in a portion of the first film inside an outer edge of a convex portion formed by steps between upper faces of the electrode and the structure so as to expose a first portion as a portion of the upper face of the electrode, forming a second film covering the first film and the first portion, forming a protective film covering the first portion, the convex portion, and a periphery of the convex portion by patterning the second film, and forming a third film on the first film and the protective film by spin coating.

8 Claims, 4 Drawing Sheets

(56) References Cited

U.S. PATENT DOCUMENTS

| | | | |
|---|---|---|---|
| 2006/0138578 A1* | 6/2006 | Lim | H01L 27/14627 257/432 |
| 2006/0141654 A1* | 6/2006 | Lim | H01L 27/14627 438/48 |
| 2006/0292734 A1* | 12/2006 | Kim | H01L 27/14621 438/70 |
| 2007/0082423 A1* | 4/2007 | Lee | H01L 27/14627 438/60 |
| 2008/0001155 A1* | 1/2008 | Jung | G02F 1/13439 257/59 |
| 2008/0150058 A1* | 6/2008 | Park | H01L 27/14632 257/432 |
| 2008/0150060 A1* | 6/2008 | Im | H01L 27/14687 257/432 |
| 2008/0224136 A1* | 9/2008 | Wang | H01L 27/1463 257/53 |
| 2009/0146150 A1* | 6/2009 | Hosoya | G02F 1/1368 257/59 |
| 2009/0146236 A1* | 6/2009 | Lee | G03F 7/033 257/432 |
| 2009/0170233 A1* | 7/2009 | Yun | H01L 27/14687 438/65 |
| 2010/0323458 A1* | 12/2010 | Fritsch | H01L 41/319 438/3 |
| 2011/0024858 A1* | 2/2011 | Yoshihara | H01L 27/14627 257/432 |
| 2012/0052606 A1* | 3/2012 | Yamazaki | H01L 27/1225 438/23 |
| 2012/0217498 A1* | 8/2012 | Yamanaka | H01L 27/1461 257/48 |
| 2013/0334656 A1* | 12/2013 | Jin | H01L 23/5256 257/529 |
| 2013/0335590 A1* | 12/2013 | Kurihara | H01L 31/02325 348/222.1 |
| 2014/0339543 A1* | 11/2014 | Yamazaki | H01L 27/1225 257/43 |
| 2015/0001503 A1* | 1/2015 | Hirose | H01L 27/307 257/40 |
| 2015/0056741 A1* | 2/2015 | Kurihara | H01L 27/14621 438/70 |
| 2015/0236069 A1* | 8/2015 | Inatani | H01L 27/14685 438/70 |
| 2015/0303226 A1* | 10/2015 | Kurihara | H01L 27/14685 257/432 |

FOREIGN PATENT DOCUMENTS

| | | |
|---|---|---|
| JP | 2008-032521 A | 2/2008 |
| JP | 2008-034521 A | 2/2008 |

\* cited by examiner

METHOD OF MANUFACTURING SEMICONDUCTOR APPARATUS

BACKGROUND OF THE INVENTION

1. Field of the Invention

The present invention relates to a method of manufacturing a semiconductor apparatus.

2. Description of the Related Art

In steps of manufacture of a semiconductor apparatus, spin coating is used as a method of forming (depositing) a film on a base material including a wafer. In this method, a coating liquid is supplied while rotating a wafer, thereby forming a film on the entire wafer. If the upper face of the wafer has steps, these steps may cause stripes and unevenness (so-called striations) in the film formed by spin coating. Hence, steps (difference of elevation) locally formed on the upper face of a wafer are not preferable.

A semiconductor apparatus is provided with an electrode so as to be electrically connected to an external apparatus, and a convex shape is formed on the upper face of a wafer by the electrode. This convex shape may lead to steps on the upper face of the wafer. For example, when the electrode is covered with a protective film that has an opening to partially expose the upper face of the electrode, the upper face of the protective film follows the convex shape, and steps may locally be formed on the upper face of the wafer. Hence, when further depositing a film on the semiconductor apparatus by spin coating, consideration is needed not to form the above-described striations.

SUMMARY OF THE INVENTION

The present invention provides a technique advantageous in deposition by spin coating in steps of manufacture of a semiconductor apparatus.

One of the aspects of the present invention provides a method of manufacturing a semiconductor apparatus, comprising forming an electrode on a structure, provided on a substrate, including a wiring pattern and an interlayer insulation film, forming a first film having insulating properties and covering the electrode and the structure, forming an opening in a portion of the first film inside an outer edge of a convex portion formed by steps between an upper face of the electrode and an upper face of the structure so as to expose a first portion as a portion of the upper face of the electrode, forming a second film covering the first film and the first portion, forming a protective film covering the first portion, the convex portion, and a periphery of the convex portion by patterning the second film, and forming a third film on the first film and the protective film by spin coating.

Further features of the present invention will become apparent from the following description of exemplary embodiments with reference to the attached drawings.

DESCRIPTION OF THE EMBODIMENTS

A manufacturing method according to the present invention will now be described by exemplifying a solid-state imaging apparatus as a semiconductor apparatus. However, the present invention is applicable to any other semiconductor apparatuses as well.

(First Embodiment)

A method of manufacturing a solid-state imaging apparatus $I_1$ according to the first embodiment will be described with reference to FIGS. 1 and 2. Note that the solid-state imaging apparatus $I_1$ can be manufactured by a known semiconductor manufacturing process, and the manufacturing method to be described below is merely an embodiment of the present invention.

Figure 1:
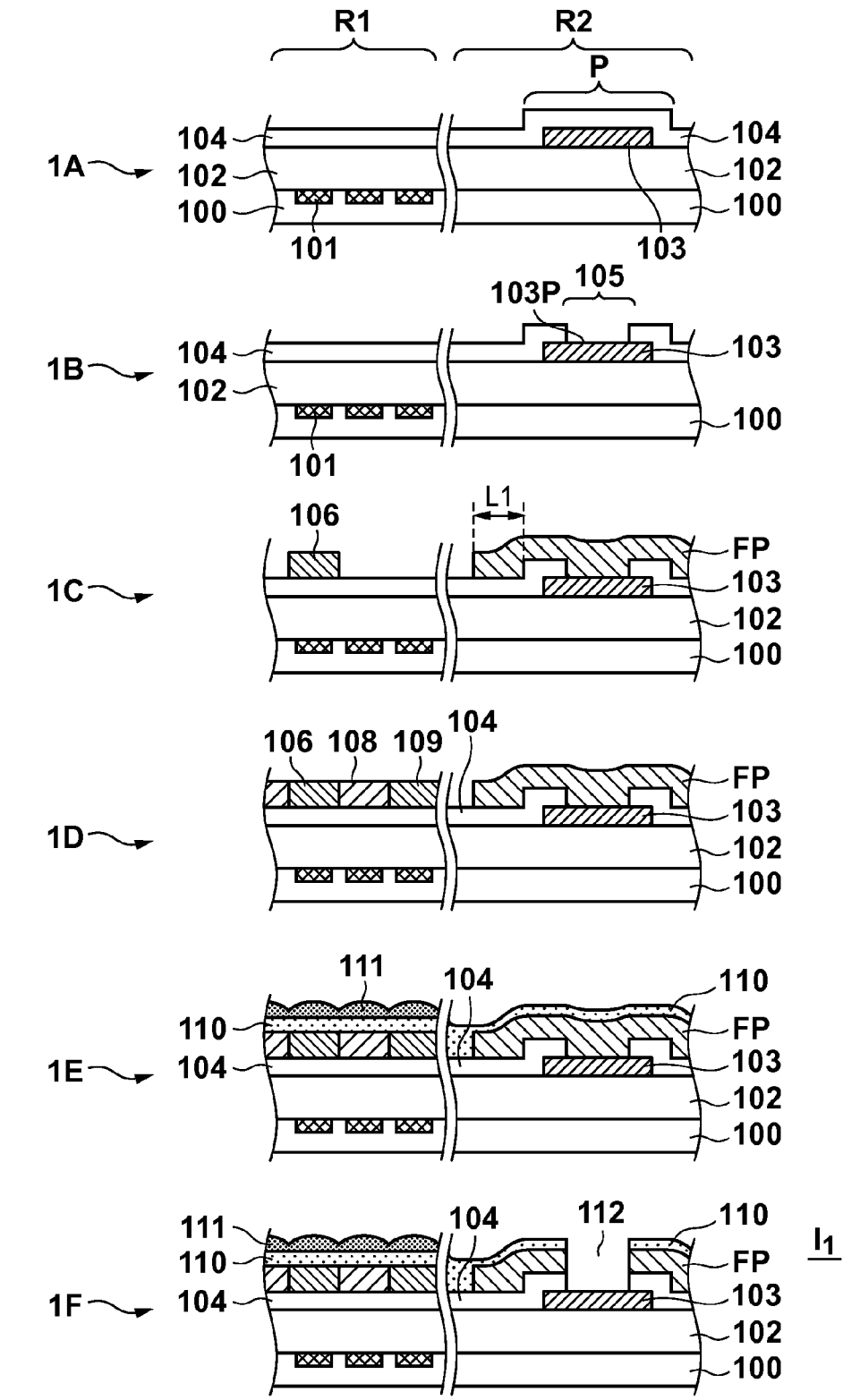
FIG. 1 shows views for explaining an example of a method of manufacturing a solid-state imaging apparatus.
Figure 2:
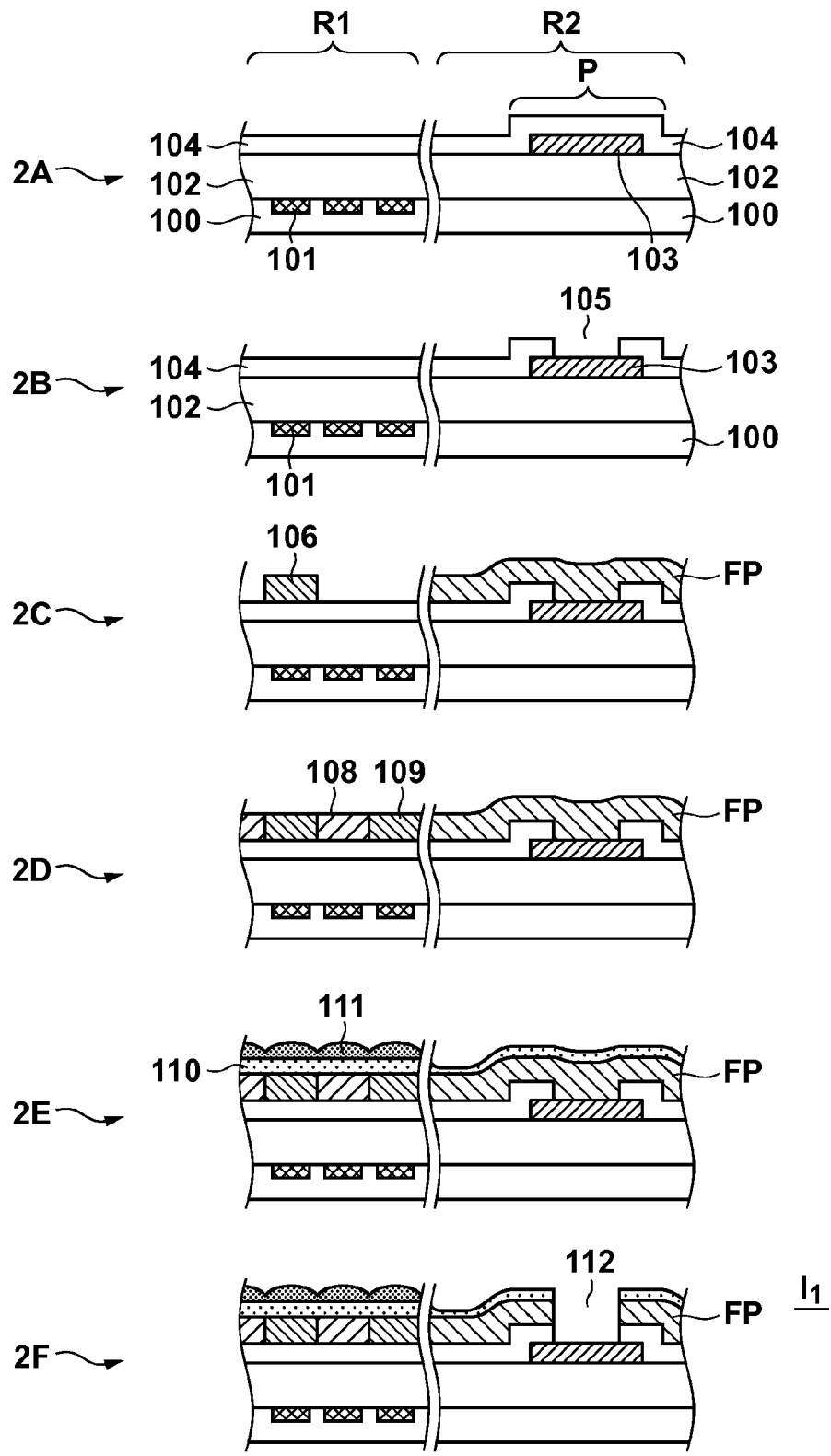
FIG. 2 shows views for explaining another example of a method of manufacturing a solid-state imaging apparatus.

FIG. 1 schematically illustrates an example of a method of manufacturing the solid-state imaging apparatus $I_1$ in several steps. As shown in 1F of FIG. 1 illustrating the final step, the solid-state imaging apparatus $I_1$ includes a pixel region R1 where photoelectric conversion portions such as photodiodes are arranged, and an electrode region R2 where an electrode configured to read out image data obtained by the photoelectric conversion portions is arranged. A case where a pixel array including color filters in Bayer arrangement is provided in the region R1 will be exemplified below.

First, as shown in 1A of FIG. 1, a substrate 100 including a plurality of photoelectric conversion portions 101 arrayed in the region R1 is prepared. The substrate 100 is obtained by, for example, forming elements such as transistors and photodiodes on a semiconductor substrate by semiconductor manufacturing processes including vapor deposition, patterning, and ion implantation. Alternatively, a substrate on which the elements are already formed may be prepared.

A structure 102 including a wiring pattern and an interlayer insulation film is provided on the substrate 100. The structure 102 can be formed by, for example, alternately providing insulation layers and wiring layers. An electrode 103 is formed in the region R2 of the structure 102. Note that the electrode 103 can include not only an electrode configured to read out a signal obtained by the photoelectric conversion portions 101 but also an electrode configured to supply power to a control signal to read out the signal. A protective film 104 (first film having insulating properties) is formed on the electrode 103 and the structure 102 and covers them.

As shown in 1B of FIG. 1, an opening 105 is formed in a portion of the protective film 104 inside the outer edge of a convex portion P formed by the steps between the electrode 103 and the structure 102 so as to expose a portion (first portion 103P) of the upper face of the electrode 103. In other words, the opening 105 is formed inside the outer edge of the electrode 103 when the upper face of the substrate 100 is viewed from the upper side. The steps indicate the difference of elevation generated between the upper face of the electrode 103 and that of the structure 102. For example, in an arrangement in which the film thickness of the protective film 104 is smaller than that of the electrode 103, the convex portion P is a portion at which the upper face of the protective film 104 is located on the electrode 103. The outer edge of the convex portion P can be said to be an end of a region where the upper face of the protective film 104 is flat on the structure 102 in a direction from above the electrode 103 to its outer edge.

As shown in 1C of FIG. 1, a first color filter 106 (green color filter) is formed immediately above one of the photoelectric conversion portions 101 corresponding to, for example, a green pixel in the region R1. The color filter 106 can be obtained by applying a color filter material and then performing patterning by exposure processing and development processing.

In the region R2, a protective film FP is formed using the color filter material so as to cover the protective film 104 and the portion 103P. The protective film FP is formed together with the color filter 106 by forming a film (second film) of the color filter material on the protective film 104 and the portion 103P by spin coating and then patterning the film. The protective film FP is formed to cover the convex portion P, the portion 103P, and their periphery, and protects the electrode 103 (portion 103P) from processing to be performed later. That is, the protective film FP is formed on the protective film 104 on the electrode 103 and on the protective film 104 that is not located on the electrode 103. The protective film FP extends from the protective film 104 on the electrode 103 to a portion out of the protective film 104 that is not located on the electrode 103 at which at least the upper face of the protective film FP flattens. The above-described patterning (patterning of the film of the color filter material) for formation of the protective film FP is performed such that a distance L1 from the outer edge of the convex portion P to the outer edge of the protective film FP becomes, for example, 40 [μm] or more. The film thickness of the film of the color filter material is preferably larger than the thickness of the electrode 103. This reduces the influence of the difference of elevation at the convex portion P in exposure processing.

As shown in 1D of FIG. 1, a second color filter 108 (blue color filter) is formed immediately above one of the photoelectric conversion portions 101 corresponding to, for example, a blue pixel in the region R1. In a similar manner, a third color filter 109 (red color filter) is formed immediately above one of the photoelectric conversion portions 101 corresponding to a red pixel. The color filters 108 and 109 are formed by forming a film of a color filter member by spin coating and then performing exposure processing and development processing, like the above-described color filter 106.

As shown in 1E of FIG. 1, a planarization film 110 is formed across the regions R1 and R2. An optical system including microlenses 111 corresponding to the photoelectric conversion portions 101 is formed on the planarization film 110. The microlenses 111 are formed by applying a microlens member and then performing exposure processing and development processing or by a reflow method. Note that in this embodiment, the protective film FP is formed from a color filter member, and does not use any other member (second planarization film or the like). Hence, the distance between the photoelectric conversion portions 101 and the microlenses 111 shortens, and the light sensitivity of the solid-state imaging apparatus $I_1$ can improve.

Finally, as shown in 1F of FIG. 1, the planarization film 110 and the protective film FP are selectively removed by etching in the region R2, thereby forming an opening 112 to expose the upper face of the electrode 103. The solid-state imaging apparatus $I_1$ is thus obtained and then mounted on a mount substrate using wire bonding or the like.

As described above, according to this embodiment, the protective film FP is formed across the convex portion P, the portion 103P, and their periphery, as shown in 1C of FIG. 1, thereby preventing the difference of elevation from locally becomes large. More specifically, according to this embodiment, the local difference of elevation on the upper face is small as compared to a case where the protective film FP is formed to cover, for example, only the upper face of the convex portion P and that of the portion 103P. This prevents striations that may occur upon spin coating to be performed later. In addition, the protective film FP protects the electrode 103 from subsequent processes, for example, corrosion by a developer in exposure processing and development processing. Hence, according to this embodiment, the protective film FP protects the electrode 103 while preventing occurrence of striations. This is advantageous in manufacturing the solid-state imaging apparatus $I_1$.

In this embodiment, the protective film FP is formed such that the distance L1 from the outer edge of the convex portion P to the outer edge of the protective film FP becomes, for example, 40 [μm] or more. However, the present invention is not limited to this. The protective film FP may be formed to cover a region other than the region R1 in addition to the region R2, as needed. FIG. 2 shows another example of the method of manufacturing the solid-state imaging apparatus $I_1$. As shown in 2C of FIG. 2, the protective film FP can be formed to cover the region R2 and a region (for example, a region including an optical black pixel or dummy pixel or a region where a peripheral circuit or the like is provided) other than the effective pixel region. Note that the steps other than 2C of FIG. 2 are the same as in FIG. 1, and a description thereof will be omitted.

(Second Embodiment)

Figure 3:
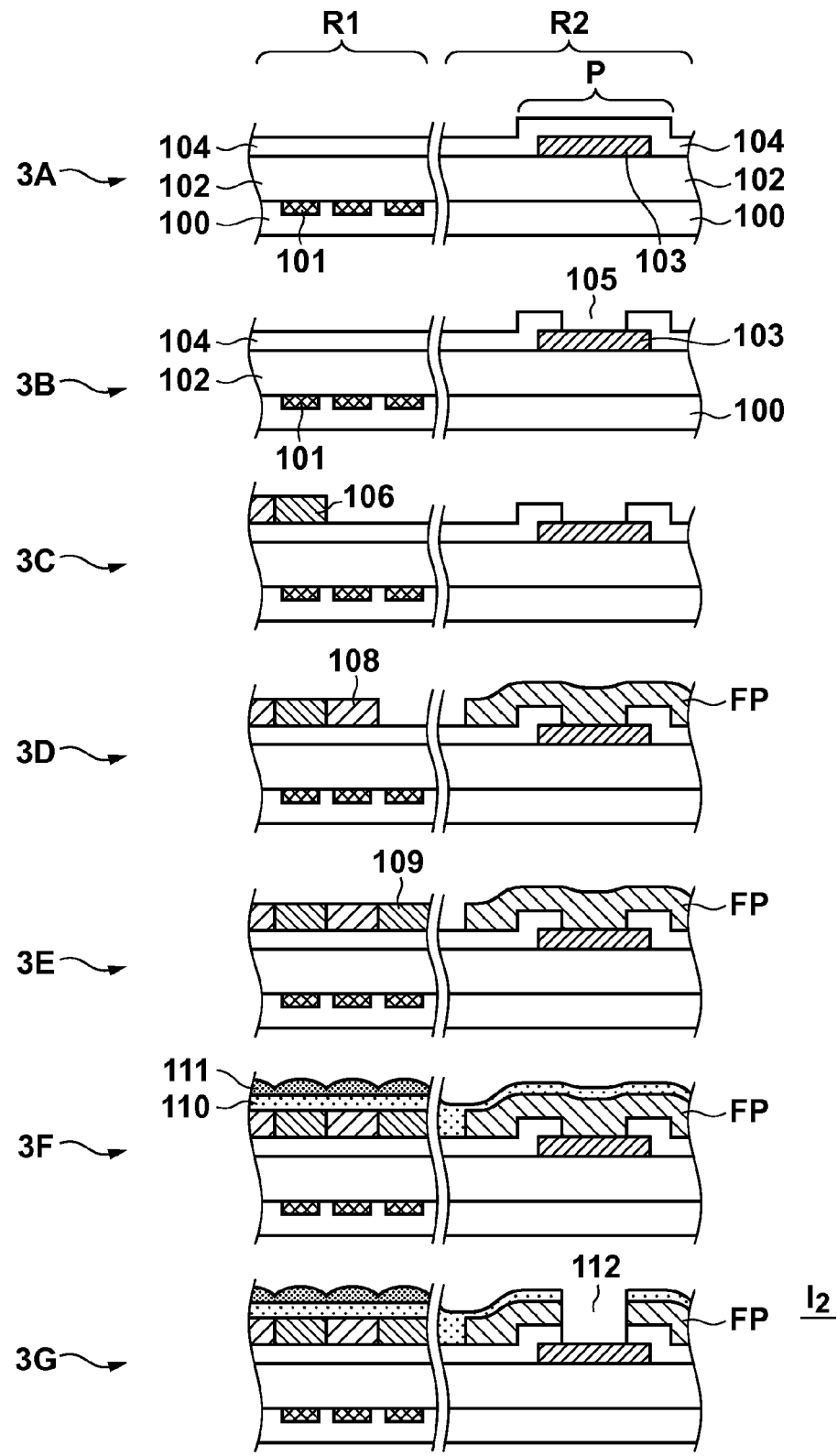
FIG. 3 shows views for explaining still another example of a method of manufacturing a solid-state imaging apparatus.
Figure 4:
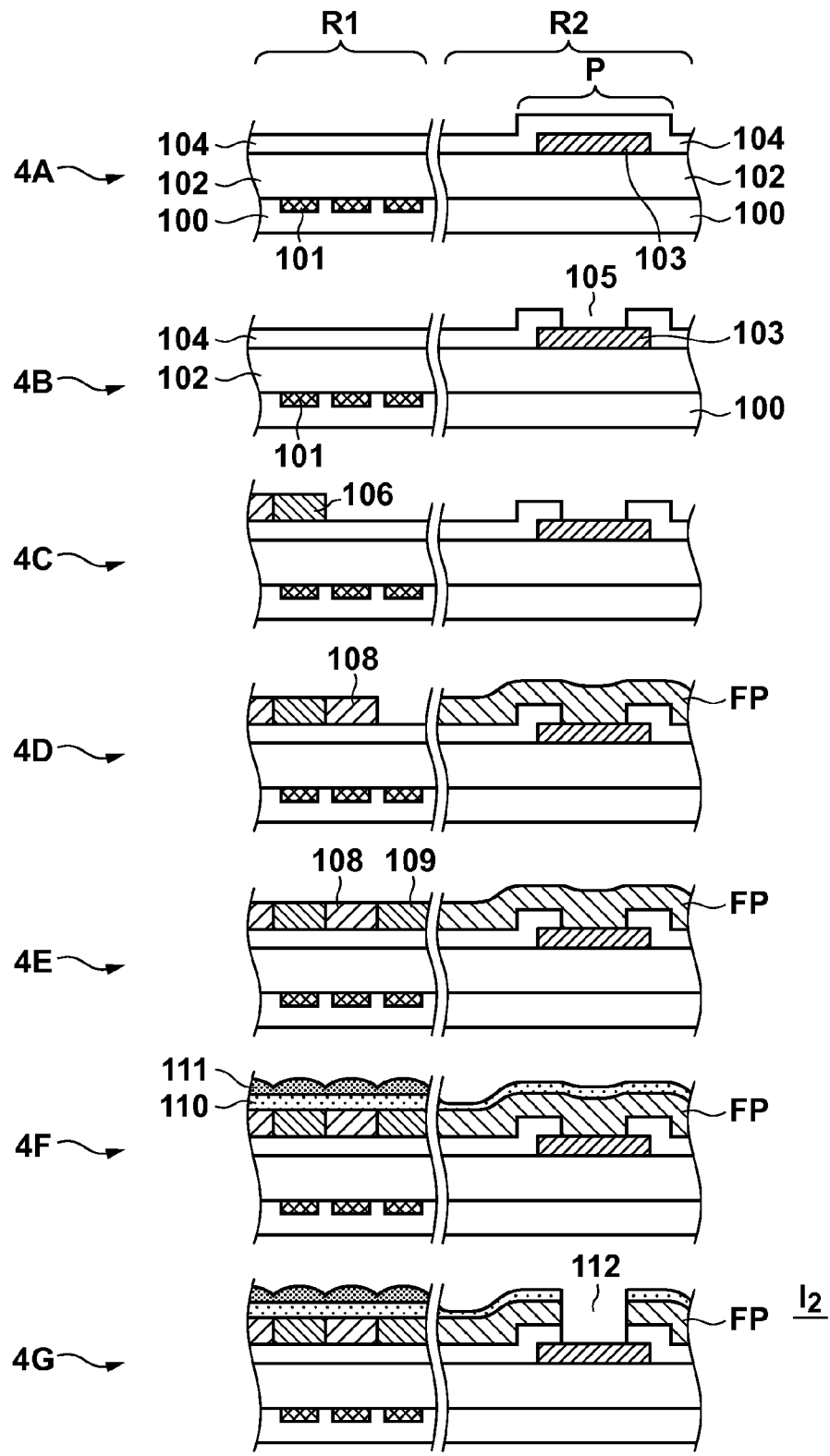
FIG. 4 shows views for explaining still another example of a method of manufacturing a solid-state imaging apparatus.

A method of manufacturing a solid-state imaging apparatus $I_2$ according to the second embodiment will be described with reference to FIGS. 3 and 4. In the first embodiment, a form has been exemplified in which the protective film FP is formed when forming the first color filter 106 so as to protect the electrode 103 from processes including the formation process of the second color filter 108 and the third color filter 109. However, the present invention is not limited to this. The protective film FP need only be formed together with one of the color filters, and may be formed together with, for example, the second color filter 108. FIG. 3 schematically illustrates an example of a method of manufacturing the solid-state imaging apparatus $I_2$ in several steps.

First, as shown in 3A of FIG. 3, an electrode 103 is formed in a region R2 of a structure 102 provided on a substrate 100. A protective film 104 is formed on the electrode 103 and the structure 102 and covers them.

As shown in 3B of FIG. 3, an opening 105 is formed in a portion of the protective film 104 inside the outer edge of a convex portion P formed by the steps between the electrode 103 and the structure 102 so as to expose a portion (first portion 103P) of the upper face of the electrode 103.

As shown in 3C of FIG. 3, a first color filter 106 (green color filter) is formed immediately above one of photoelectric conversion portions 101 corresponding to, for example, a green pixel in a region R1.

As shown in 3D of FIG. 3, a second color filter 108 (blue color filter) is formed immediately above one of the photoelectric conversion portions 101 corresponding to, for example, a blue pixel in the region R1. In the region R2, a protective film FP is formed using the color filter material of the color filter 108 so as to cover the protective film 104 and the portion 103P. The protective film FP is formed by patterning a film of the color filter material, as in the first embodiment (1C of FIG. 1). The patterning can be performed such that a distance L1 from the outer edge of the convex portion P to the outer edge of the protective film FP becomes, for example, 40 [μm] or more. The protective film FP protects the electrode 103 from subsequent processes.

As shown in 3E of FIG. 3, a third color filter 109 (red color filter) is formed immediately above one of the photoelectric conversion portions 101 corresponding to, for example, a red pixel in the region R1.

As shown in 3F of FIG. 3, a planarization film 110 is formed across the regions R1 and R2. An optical system (for example, microlenses 111 corresponding to the photoelectric conversion portions 101) is formed on the planarization film 110.

Finally, as shown in 3G of FIG. 3, the planarization film 110 and the protective film FP are selectively removed by etching in the region R2, thereby forming an opening 112 to expose the upper face of the electrode 103. The solid-state imaging apparatus $I_2$ is thus obtained.

As described above, the protective film FP may be formed together with another color filter. According to this embodiment as well, the same effect as in the first embodiment can be obtained. More specifically, striations that may occur upon spin coating to be performed later are prevented. Hence, according to this embodiment, this is advantageous in manufacturing the solid-state imaging apparatus $I_2$.

In this embodiment, the protective film FP is formed such that a distance L1 from the outer edge of the convex portion P to the outer edge of the protective film FP becomes, for example, 40 [μm] or more. However, the present invention is not limited to this. The protective film FP may be formed to cover a region other than the region R1 in addition to the region R2, as needed. FIG. 4 shows another example of the method of manufacturing the solid-state imaging apparatus $I_2$. As shown in 4D of FIG. 4, the protective film FP can be formed to cover the region R2 and a region (for example, a region including an optical black pixel or dummy pixel or a region where a peripheral circuit or the like is provided) other than the effective pixel region. Note that the steps other than 4D of FIG. 4 are the same as in FIG. 3, and a description thereof will be omitted.

Two embodiments have been described above. However, the present invention is not limited to those. Changes and modifications can appropriately be made in accordance with objects, states, application purposes, functions, and other specifications, and the present invention can also be implemented by other embodiments. For example, in the above-described embodiments, a form has been exemplified in which the protective film FP is formed together with a color filter. However, the present invention is not limited to this, and can include a case where the protective film FP is formed together with another film. Additionally, for example, the above-described various kinds of films can be either single-layer films or multilayer films.

In the above embodiments, the present invention has been described by exemplifying a solid-state imaging apparatus included in an imaging system represented by a camera or the like. The concept of the imaging system includes not only apparatuses primarily aiming at shooting but also apparatuses (for example, personal computer and portable terminal) secondarily having a shooting function. The imaging system can include the solid-state imaging apparatus exemplified in the above embodiments, and a processor that processes a signal output from the solid-state imaging apparatus. The processor can include, for example, an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-172662, filed Aug. 22, 2013, which is hereby incorporated by reference herein in its entirety.

What is claimed is:

1. A method of manufacturing a solid-state imaging apparatus, comprising a plurality of photoelectric conversion portions arranged on a substrate, a plurality of microlenses provided in correspondence with the plurality of photoelectric conversion portions, and a plurality of color filters provided between the plurality of photoelectric conversion portions and the plurality of microlenses, the method comprising:
forming an electrode on a structure provided on the substrate, the structure including a wiring pattern and an interlayer insulation film;
forming a first film having insulating properties, the first film covering the electrode and the structure;
forming an opening in a portion of the first film inside an outer edge of a convex portion formed by steps between an upper face of the electrode and an upper face of the structure so as to expose a first portion as a portion of the upper face of the electrode;
forming a second film covering the first film and the first portion;
patterning the second film to form a first color filter and a protective film simultaneously, the first color filter being one of the plurality of color filters, and the protective film covering the first portion, the convex portion, and a periphery of the convex portion; and
forming a third film on the first film and the protective film by spin coating.

2. The method according to claim 1, wherein the apparatus includes a pixel region and an electrode region when viewed from an upper side,
wherein the plurality of photoelectric conversion portions, the plurality of microlenses, and the plurality of color filters are provided in the pixel region,
wherein the electrode and the protective film are provided in the electrode region, and
wherein, in the patterning the second film, the second film is patterned such that, in the electrode region among the pixel region and the electrode region, a distance from the outer edge of the convex portion of the first film to an outer edge of the protective film becomes not less than 40 μm.

3. The method according to claim 1, wherein the protective film is made of the same member as the first color filter having one of a plurality of colors.

4. The method according to claim 1, further comprising forming a second color filter having a color different from the first color filter by performing exposure processing and development processing for the third film formed in the forming the third film.

5. The method according to claim 4, further comprising forming a third color filter before the forming the third film.

6. The method according to claim 1, further comprising, after the forming the third film, removing the protective film and the third film and forming an opening so as to partially expose the upper face of the electrode.

7. The method according to claim 1, wherein a thickness of the second film is larger than that of the electrode.

8. The method according to claim 1, wherein the second film covers the first film located on the electrode, and covers the first film that is not located on the electrode and has a flat upper face.

* * * * *